United States Patent [19]
Ocken, Jr.

[11] 3,869,563
[45] Mar. 4, 1975

[54] ENCAPSULATION HOUSING FOR ELECTRONIC CIRCUIT BOARDS OR THE LIKE AND METHOD OF ENCAPSULATING

[75] Inventor: Alfred Ocken, Jr., Franklin Park, Ill.

[73] Assignee: Motorola, Inc., Chicago, Ill.

[22] Filed: Sept. 27, 1973

[21] Appl. No.: 401,471

[52] U.S. Cl. .................... 174/52 PE, 29/627, 53/36, 206/328, 220/23.4, 264/272, 317/101 DH
[51] Int. Cl. ............................ H05k 5/06, B29c 6/02
[58] Field of Search ......... 174/52 R, 52 PE; 317/99, 317/100, 101 R, 101 CC, 101 DH; 336/96; 338/226, 252, 253, 256, 275; 29/627; 53/36; 264/272; 206/73, 328; 220/23.4

[56] References Cited

UNITED STATES PATENTS

| | | | |
|---|---|---|---|
| 3,343,706 | 9/1967 | Berend | 220/23.4 |
| 3,484,536 | 12/1969 | Jaeschke et al. | 174/52 PE |
| 3,590,480 | 7/1971 | Johnson, Jr. et al. | 174/52 PE X |
| 3,729,657 | 4/1973 | Callan et al. | 317/101 DH |
| 3,772,452 | 11/1973 | Usowski | 174/52 PE |
| 3,806,766 | 4/1974 | Fanning | 264/272 X |

FOREIGN PATENTS OR APPLICATIONS

| | | | |
|---|---|---|---|
| 1,027,066 | 3/1958 | Germany | 206/73 |
| 1,096,067 | 12/1960 | Germany | 206/73 |

*Primary Examiner*—Laramie E. Askin
*Attorney, Agent, or Firm*—Donald J. Lisa; James W. Gillman

[57] ABSTRACT

A control device assembled on a circuit board is suitably encapsulated within a protective housing on a multiple unit basis especially suited for automation. A plurality of housings are arranged in an upright, side-by-side relation so that the associated circuit board may be inserted from a vertical direction and correctly positioned within the housing by a pair of guide rails and the action of gravity. The housings may then be suitably encapsulated utilizing a continuous and uninterrupted flow of encapsulating material.

The housing itself is fabricated of a non-metallic, thermosetting material unaffected during subsequent operation in elevated ambient temperatures. The housing further includes a laterally extending lip or ledge which overlies a top portion of the next adjacent housing during assembly and encapsulation. Mounting holes are provided of a configuration to permit a wide variety of mounting locations.

20 Claims, 5 Drawing Figures

PATENTED MAR 4 1975

3,869,563

ENCAPSULATION HOUSING FOR ELECTRONIC CIRCUIT BOARDS OR THE LIKE AND METHOD OF ENCAPSULATING

BACKGROUND OF THE INVENTION

The present invention relates in general to housings for electrical or electronic components and more particularly to an improved method and apparatus for housing and encapsulating such components.

Without affecting any limitations as to other applications, the present invention is set forth and described in the environment of protective housings intended for control devices in vehicles such as, for example, electronic voltage regulators.

With the advent of semi-conductors and the development of companion technologies, such as the thick film art and the like, many new applications are being found for solid state control devices of one sort or another. This includes voltage regulators and other control circuits, for electronic ignition systems for automotive and other motor vehicles.

Because of the relatively hostile environment in which such control devices, e.g., voltage regulators, must operate, some sort of weather or environmental protection is necessary for the desired reliability of operation. The corrosive fluids and other undesirable ambient factors encountered under the hood of an automobile are much too detrimental for such electronic components without some environmental protection. The same is true with respect to high velocity air movements that very likely will be encountered. At the same time, however, there must be an opportunity for adequate heat dissipation for these components or breakdown will occur at some given elevation in ambient temperature.

In the past, protective housings or enclosures employed for these type of control devices, such as a voltage regulator for example, have comprised a simple metallic enclosure, usually open at the bottom, and in which the associated electrical or electronic control circuit board is intended to be placed. Customarily, the interior is then encapsulated with a suitable material for full-range protection. Nevertheless, such encapsulation was more often than not accomplished by hand, one unit at a time. In addition, some means was necessary to position and then maintain the associated circuit board internally of the housing in the required relation before and of course during the encapsulation process.

The result was a unit unduly expensive and time consuming to fabricate, particularly in view of the cadmium or zinc coating required for the metallic housing and the hand operation required for the encapsulation process. Additionally, the finished unit was more often than not oversized when considering the control circuit board that it housed. This translates into even greater expense when considering the cost of the extra encapsulation material required. In many cases, the heat dissipation capacity has been deficient in that the encapsulation material effectively isolated the internal components from the outside ambient.

Accordingly, it is one object of the present invention to provide a protective housing for electrical components operative in a hostile environment which does not exhibit the foregoing deficiencies.

A more particular object of the present invention is to provide a protective housing for an electronic voltage regulator or the like for underhood operation in a motor vehicle which is less costly to produce, more compact in size, and insures more reliable operation.

Another object of the present invention is to provide an improved method of final assembly and encapsulation for such voltage regulator unit or other control device which is adapted to automation, or at least multiunit production as contrasted to hand operation.

Yet another object of the present invention is to provide a protective housing for a voltage regulator or other device which is non-metallic, yet stabilized in configuration notwithstanding being subjected to relatively high ambient temperatures in operation and further which is non-reactive to other ambient factors.

Still another object of the present invention is to provide a protective housing of the foregoing type wherein internally positioned guide rails insure the associated circuit board is optimally positioned within the housing for proper heat dissipation action.

It is another object of the present invention to provide a protective housing of the foregoing type which contemplates vertical assembly of the associated control circuit boards and permits proper positioning therein by the action of gravity.

A further object of the present invention is to provide a protective housing of the foregoing type suitable for stacking in a vertical, side-by-side relation wherein one portion of each such housing effectively overlaps a portion of an adjacent housing so as to permit a continuous encapsulation process therefor.

SUMMARY OF THE INVENTION

In one aspect of the invention, a protective housing is provided for accommodating a circuit board with components comprising a voltage regulator or other like control device. The housing is designed to accept the insertion of the circuit board from a vertical direction with tracks or guide rails on opposing side walls which serve to guide or steer the circuit board to its intended position within the housing by the action of gravity.

The housing itself is formed of a non-metallic, thermosetting plastic material which remains stabilized in its set condition despite elevated temperatures to which it may be subsequently subjected. The finished, i.e., encapsulated, unit is designed for mounting on the fire wall or interior wall of a fender with the associated heat sink interior of the housing positioned adjacent thereto for appropriate head dissipation action. Alternatively, the housing may be mounted directly on the motor vehicle's alternator unit.

For facilitating the required encapsulation process, the housing includes a laterally projecting lip for overhanging an edge of an adjacent housing when both are stacked together in a vertical side-by-side relation. The housing units are maintained in this relation by tubular rods or other fastening means passing through apertures extending therethrough and which subsequently serve as the holes necessary for mounting the individual finished units.

BRIEF DESCRIPTION OF THE DRAWINGS

The features of the present invention which are believed to be novel are set forth with particularity in the appended claims. The invention itself, however, together with further objects and advantages thereof, may be better understood by reference to the accompanying drawings, in which:

BRIEF DESCRIPTION OF A PREFERRED EMBODIMENT

Figures 1, 2, 3, 4, 5:
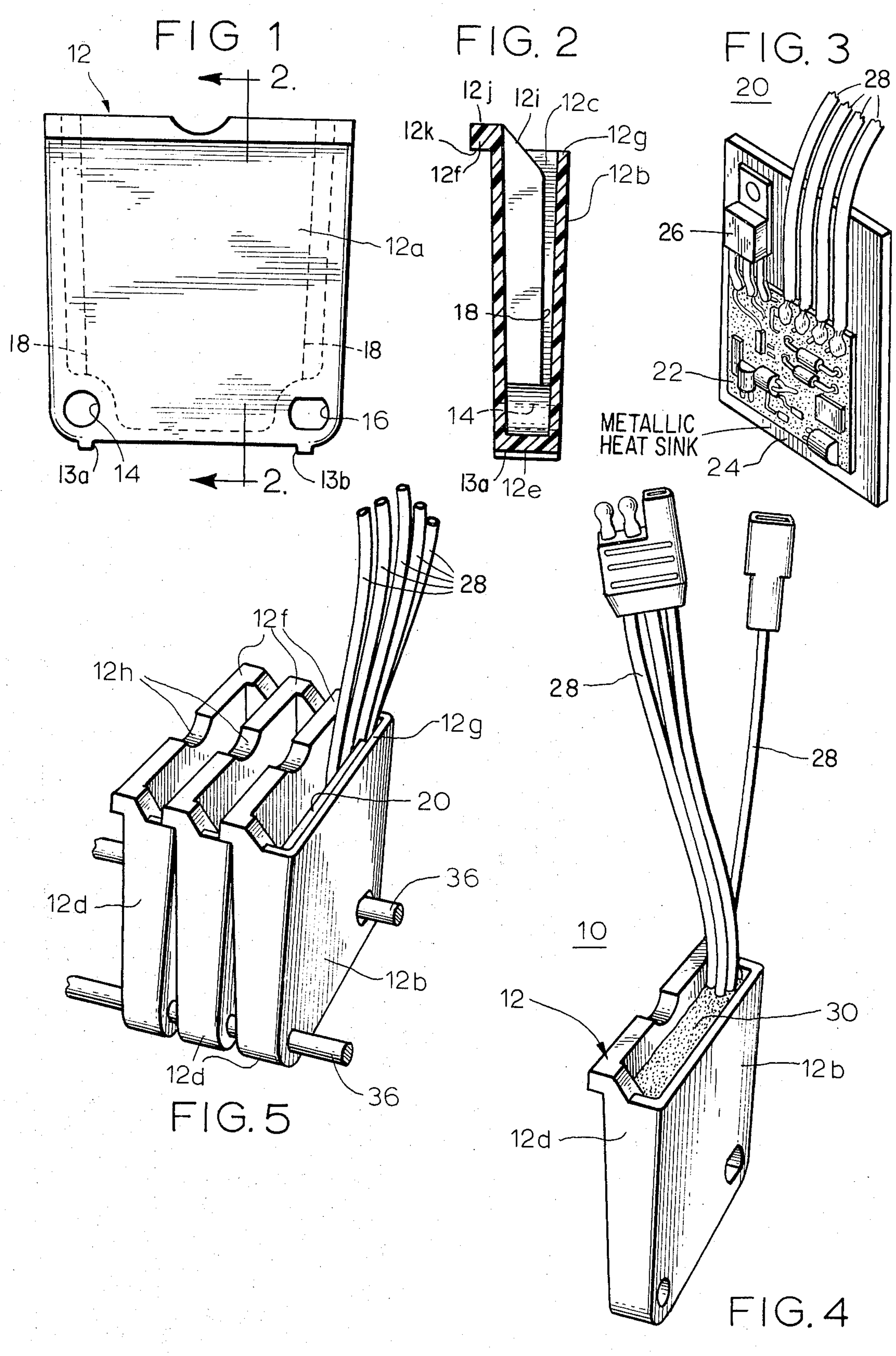
FIG. 1 is a front elevational view of a protective housing constructed in accordance with the present invention.
FIG. 2 is a cross-sectional view of the housing of FIG. 1 taken generally along lines 2—2.
FIG. 3 is a view in perspective of an associated circuit board forming an electronic voltage regulator and which is intended to be encapsulated in the housing of FIG. 1.
FIG. 4 is a view in perspective of the finished and encapsulated voltage regulator unit.
FIG. 5 is a view in perspective of a plurality of such housing units of FIG. 1 shown in a vertically stacked, side-by-side relation for encapsulation in multiple-unit assembly.

Referring now to the drawings, the finished voltage regulator unit 10 is shown in FIG. 4, which regulator includes a protective housing 12. The housing 12, in one aspect in accordance with the present invention, is shown in vertical plan view in FIG. 1. As seen in FIGS. 2, 4 and 5, the housing 12 is in the form of an upright, narrow-based enclosure defined by upstanding walls 12*a*, 12*b*, 12*c* and 12*d*, in conjunction with the bottom wall or base 12*e*. *Support members 13a*, 13*b* are formed on the bottom of the housing. Front and back walls 12*a* and 12*b* have a substantially wider dimension than the respective side walls 12*c* and 12*d*, say, for example, by a ratio of some 4:1. However, it is to be understood that this is no way critical to the present invention, and the dimensions of the housing 12 will be, and indeed are expected to be, tailored to best accommodate the interior-placed circuit board arrangement to be discussed subsequently.

In any event, housing 12 further includes a pair of apertures 14 and 16 intended for mounting the overall control device, in this case the voltage regulator 10, under the hood, or elsewhere, in its intended application environment. Apertures 14 and 16 serve a further purpose which likewise will be covered in more detail herein below. However, it may be noted that apertures 14 and 16 extend entirely through housing 12 on respective sides immediately above the base portion 12e. As best seen in FIG. 2, apertures 14 and 16 are closed off from the interior of housing 12. In addition, while aperture 14 is essentially circular in cross sectional area, aperture 16 is somewhat elongated, as will be appreciated upon reference to FIG. 1. With this particular hole configuration, the control unit 10, when fully assembled, may be mounted directly on the alternator assembly (not shown) of the associated vehicle or, alternatively, on an appropriate location on the fire wall or interior wall of the fender.

Housing 12 is constructed to accommodate an associated circuit board, such as that identified at 20, comprising a control device of some sort or another, such as a electronic voltage regulator. Circuit board 20 includes substrate element 22 and heat sink 24. Heat sink 24 is formed as a flat board having a front and rear major surface area. The regulator preferably is designed using thick film techniques. This permits a substrate element or base 22 to be utilized on which various of the circuit paths, as well as the necessary resistance elements, may be formed directly therein. The associated discrete transistor devices and capacitor elements may then be mounted physically thereon and suitably interconnected, such as by solder reflow techniques or the like. The entire substrate assembly may then be cemented taped or otherwise attached to the front major surface of a metallic heat sink 24 of a suitable material, such as aluminum, for optimum heat dissipation capabilities. Additional circuit components may be separately attached or cemented to heat sink 24 as well, for example, the power switching transistor 26. The necessary external control leads 28 are then attached directly to the substrate element 22 at appropriate terminal points.

It is of course to be understood that the actual circuit design of the voltage regulator device is in no way critical nor effective as any limitation on the present invention. The operation of a voltage regulator of this or any other conventional type is readily understood by those skilled in the art such that further detailed description is deemed unnecessary.

As will be appreciated upon reference to FIG. 2, a track or guide rail 18 extends downwardly along the interior of each of the side walls 12c and 12d. Guide rails 18 are shaped to define a flared or tapered opening, wider at the top than at the bottom, such that the circuit board assembly 20 may be easily inserted from a vertical direction into housing 12 and permitted upon release to be guided to its proper position by the pull of gravity. The intended position contemplates the heat sink 24 lying immediately adjacent to and in substantial contact with the upstanding wall 12*b*, as best seen in FIG. 5. In this referenced position, maximum heat transfer will be permitted between the heat sink 24 and the wall 12*b* of housing 12 and thus out to the ambient. It also prevents the isolation of the heat sink and circuit component parts by the subsequently added encapsulation material which may otherwise get between the heat sink and wall 12*b*.

With the circuit board assembly 20 properly seated and positioned within the housing 12, encapsulating material 30 may then be poured into and thereby fill the remainder of the interior space. The material 30 is then allowed to set or harden. The finished or assembled unit is shown in FIG. 4. The result is a hermetically sealed voltage regulator unit 10 with only the control leads 28 protruding therefrom, as indicated, for subsequent interconnection at appropriate terminal or reference points within the alternator and ignition systems (not shown).

The housing may be fabricated from any suitable material. In its preferred form, however it is compression molded from a non-metallic, but permanently stabilized plastic compound. By permanently stabilized, it is meant that once formed by the thermosetting material, it remains substantially in that form notwithstanding that the housing may be subjected to elevated ambient temperatures during subsequent operation. One such compound found to provide satisfactory operational characteristics is an alkyd material. Presently, it is marketed by the Cyanamid Company under the trade designation Alkyd 3001. However, it is to be understood that other thermosetting materials are available and which provide satisfactory operation and, in any event, the present invention is in no way limited to any particular brand or type of fabrication material nor to the way it is formed or processed.

METHOD OF ENCAPSULATION

A significant design feature of the housing 12 is its adaptability to multi-unit assembly, including the desired encapsulation process therefor. As indicated in FIG. 5, a plurality of housings 12 may be arranged in an upright, side-by-side relation. A lip or ledge 12*f* extends laterally and outwardly from the top of wall 12*a* and overhangs a top edge portion 12*g* of wall 12*b* of the next adjacent housing 12. A shallow channel or trough 12*h* is located centrally in the top of ledge 12*f*, as shown in the drawings.

As seen in FIG. 2 the underside or bottom edge 12*k* of the lip 12*f* lies in a horizontal plane which includes the top edge 12*g* of the rear wall 12*b*. Thus, when the housings are ganged or stacked in vertical side-by-side relation as shown in FIG. 5, the bottom edge 12*k* of the lip 12*f* overlies the top edge 12*g* of the rear wall 12*b*. The portion of the side wall 12*i* which extends to the top edge 12*j* of the ledge is a smooth extension of the channel 12*c* to assist in inserting the board 20 into the guide rails and starting to move it rearwardly toward the rear wall 12*b* of the housing.

The plurality of housings 12 are maintained in the afore-described side-by-side, vertically stacked, position by a pair of rod-like members or shafts 36, extending through apertures 14 and 16. In this referenced position, the circuit board assemblies 20 may be inserted into an associated housing 12 from essentially the vertical direction. As previously described, the action of gravity in conjunction with the referenced internal guide rails 18 at respective sides thereof is then effective to correctly position and maintain the circuit board assembly 20 within the housing 12.

With the completion of the insertion of circuit board assemblies 20, the interior of housings 12 may be suitably encapsulated. In the preferred form, the encapsulation will be accomplished by an automated process. However, even where a hand operation is utilized, the encapsulation itself may be effected on a multi-unit basis.

In operation, the encapsulating material may be dispensed into the vertically stacked housings from a stationary vessel (not shown) as the housings 12 themselves are transported or moved along a predetermined path as a group or assemblage. Troughs 12*h* are effective to maintain the liquid encapsulation material 30 within a prescribed area as defined by such troughs. The overlapping of the housings, i.e., ledge 12*f* positioned on top portion 12*g* of the next adjacent housing, serves to prevent the encapsulating material from spilling between housings. As a consequence, the pouring of the encapsulating material may be effected on a continuous basis, rather than a start and stop action for each individual housing. This is a particularly attractive feature, and especially with regard to adapting to a suitable automated process.

Alternatively, it may be preferred to first partially fill the interior of housing 12 with sand or like material, and then fill the remaining space with the usual encapsulation material. The latter permeates the sand or filled material before hardening to its final state. This procedure is attractive because the sand is far less in cost than any encapsulation material which can be used. Further, the sand enhances the heat dissipation capabilities of the assembly as a whole.

While certain specific embodiments have been disclosed and described herein, it is of course to be understood that other and further modifications and alternative constructions or procedures may be effected without departing from the true scope and spirit of the present invention. For example, it may be preferred to maintain the assemblage of housings 12 and depicted in FIG. 5 in a stationary position while moving the vessel from which the encapsulation material is poured along a predetermined path. This of course would be the method employed when utilizing a hand operation. In any event, the appended claims are intended to cover all such modifications and alternative constructions that may fall within the true scope and spirit of the present invention.

What is claimed is:

1. An improved protective enclosure for encapsulating an electrical control circuit arranged on a circuit board, comprising a housing structure formed with a base, vertically upstanding side walls and front and back end walls, open at the top, with a pair of guide rails, each rail extending verticaly on the interior of a respective one of said side walls, said guide rails defining a pair of congruent channels in said side walls extending contiguous to one of the end walls for guiding the control circuit board to a position flatly against the one end wall upon inserting the control board into the housing;

said housing further including a ledge extending laterally and outwardly from the top of one end wall, said ledge having a bottom edge, said other end wall having a top edge, the height of the bottom edge of said ledge above said base in relation to the height of the top edge of the other end wall above said base being dimensioned such that said housing is adaptable for stacking in multiple units in a vertical, side-by-side relation whereby said laterally extending ledge of one housing overlies the top edge of the next adjacent housing.

2. An improved protective enclosure in accordance with claim 1 wherein the width of each of said channels measured in a plane parallel to the side walls progressively tapers from a point at the top of the side walls to a point toward the bottom of the side walls whereby the associated control circuit board may be inserted from a vertical direction and positioned as aforesaid within said housing by the action of gravity.

3. An improved protective enclosure in accordance with claim 2 wherein the width of each channel tapers progressively along the entire length of the channel.

4. An improved protective enclosure in accordance with claim 2 wherein the one end wall is the front end wall, the other wall is the back end wall and the channels are contiguous the back end wall.

5. An improved protective enclosure in accordance with claim 4 wherein the ledge extends the full width of the front end wall, the ledge having a top edge surface, each side wall having a portion extending to the top edge surface of the ledge, the portion being formed as a smooth extension of the channel.

6. An improved protective enclosure in accordance with claim 1 wherein said housing is formed of non-metallic, thermosetting but permanently stabilized material when set notwithstanding being subjected to elevated ambient operating temperatures, which housing being compatible with encapsulating techniques.

7. An improved protective enclosure in accordance with claim 1 wherein said housing further includes a shallow trough positioned centrally of said laterally extending ledge for confining a stream of encapsulating material when poured into the interior of said housing to essentially the area of said trough.

8. An improved protective enclosure in accordance with claim 7 wherein said housing includes a pair of apertures extending through said front and back walls but sealed off from the interior of said housing, said apertures being of a size and configuration to permit mounting of said housing at a plurality of locations as well as being adaptable for providing a means of support for stacking of said housings together in multiple units during assembly and encapsulation of the associated control circuit board.

9. An improved protective enclosure in accordance with claim 1 wherein said edges each lie in a plane substantially perpendicular to the vertical axis of the housing.

10. An improved method of encapsulating a control device assembled on a circuit board comprising the steps of:

forming a plurality of housings, each housing being open at its top, with guide rails extending vertically downwardly in the interior thereof and a lip extending laterally and outwardly from a top portion;

vertically stacking a plurality of said housings in a side-by-side relation whereby said lip of one housing overlaps a top portion of the next adjacent housing;

inserting an associated circuit board in each of said housings, positioning each circuit board within its respective housing by guiding the same on said guide rails; and continuously pouring encapsulating material into each housing consecutively in an amount sufficient to cover the circuit board in each housing.

11. An improved method of encapsulating a control device in accordance with claim 10 wherein the positioning step includes guiding the circuit board on said guide rails under the force of gravity to a position flatly against one of the end walls.

12. An improved method of encapsulating a control device in accordance with claim 10 wherein the forming step includes providing each said lip with a shallow trough in a substantially central location thereof, and further comprising the step of constraining the encapsulation material within essentially the area defined by said troughs during the pouring of the encapsulation material into said housings.

13. An improved method of encapsulating a control device in accordance with claim 10 wherein the forming step includes providing mounting holes in the bodies of said housings and the step of vertically stacking the plurality of housings in a side-by-side relation includes inserting rod-like members through said mounting holes to support said housings as a group.

14. An improved method of encapsulating a control device in accordance with claim 10 wherein the step of forming said plurality of housings includes the fabrication of the same by compression molding from a nonmetallic, thermosetting, but permanently stabilized plastic material.

15. An improved method of encapsulating a control device in accordance with claim 10 wherein the pouring step includes first continuously pouring sand into said individual housings consecutively, said sand filling at least half of the internal volume of the respective housings, and then continuously pouring encapsulating material into each of said housings consecutively to fill the remaining volume thereof and further comprising curing the encapsulating material.

16. An improved method of encapsulating a control device assembled on a heat sink circuit board comprising the steps of:

forming a housing having a base, upstanding front and rear end walls and side walls, open at its top, with a pair of guide rails each rail extending vertically downwardly on the interior of a respective one of the side walls;

inserting the circuit board into the housing;

positioning the circuit board within the housing flatly against one of the end walls by guiding the side edges of the circuit board on the guide rails; and pouring encapsulating material into the housing in an amount sufficient to cover the control device assembled on the circuit board.

17. The method of encapsulating a control device assembled on a heat sink circuit board as claimed in claim 16 wherein the forming step includes forming a plurality of the housings, each housing having a lip extending laterally and outwardly from a top portion of one of the end walls, further comprising vertically stacking a plurality of the housings in a side-by-side relation whereby the lip of one housing overlaps a top portion of the next adjacent housing, inserting and positioning a circuit board into each housing as aforesaid, and continuously pouring encapsulating material into each housing consecutively in an amount sufficient to cover the circuit board in each housing.

18. The method of encapsulating a control device assembled on a heat sink circuit board as claimed in claim 17 wherein the lip extends from one end wall and the positioning step includes positioning the circuit board against the other end wall.

19. An encapsulated electrical control circuit comprising a housing structure formed by a base and vertically upstanding side walls and two end walls, open at the top, with a pair of congruent guide channels, each channel being in a respective one of the side walls and extending contiguous to one of the end walls, the housing defining an open cavity, a circuit board having side edges and two major surfaces and being dimensioned for receipt within the housing structure an electrical control circuit mounted on one of the major surface areas of the circuit board and dimensioned for encapsulation within the housing structure at least one electrical lead connected to the control circuit, the circuit board being received within the cavity of the housing and the side edges of the ccircuit board being received within the guide channels, the circuit board being juxtaposed one end wall in flat touching relation therewith along substantially all of the one of its major surface areas which is away from the major surface area on which the electrical control circuit is mounted, the electrical lead extending externally of the housing, and encapsulating material filling the remainder of the cavity of the housing located adjacent the major surface area of the circuit board on which the electrical control circuit is mounted in an amount sufficient to cover the electrical control circuit.

20. An encapsulated electrical control circuit as claimed in claim 19 wherein the circuit board is a metallic heat sink and is also fully encapsulated by the encapsulating material, and further comprising a pair of apertures extending through the front and back walls of the housing but sealed off from the interior of the housing, said apertures being of a size and dimensioned for mounting of said housing at a plurality of locations.

* * * * *